United States Patent
Utsunomiya et al.

[19]

[11] Patent Number: 6,154,437
[45] Date of Patent: *Nov. 28, 2000

[54] PHASE-CHANGE OPTICAL RECORDING MEDIUM AND ITS WRITING WITH HIGH RELIABILITY AFTER LONG PERIOD USE AND/OR HIGH ENVIRONMENTAL TEMPERATURE STORAGE

[75] Inventors: Hajime Utsunomiya; Tatsuya Kato; Takashi Kikukawa, all of Nagano, Japan

[73] Assignee: TDK Corporation, Tokyo, Japan

[*] Notice: This patent is subject to a terminal disclaimer.

[21] Appl. No.: 09/247,085

[22] Filed: Feb. 9, 1999

[30] Foreign Application Priority Data

Feb. 10, 1999 [JP] Japan ................................. 10-044329

[51] Int. Cl.[7] ........................................................ G11B 7/24
[52] U.S. Cl. ................................. 369/275.2; 430/270.13; 428/64.4
[58] Field of Search ............................ 369/275.1, 275.2, 369/388, 274; 430/270.13; 428/64.1, 64.4

[56] References Cited

U.S. PATENT DOCUMENTS 5,276,670  1/1994  Nogami et al. .......................... 369/116
5,545,454  8/1996  Yamada et al. ......................... 428/64.1
5,978,349  11/1999  Yoshinari et al. .................... 369/275.1

*Primary Examiner*—Tan Dinh
*Attorney, Agent, or Firm*—Oblon, Spivak, McClelland, Maier & Neustadt, P.C.

[57] ABSTRACT

In the phase change type optical recording medium of the present invention, loss of reliability by high-temperature storage is prevented, and self-erasure (a phenomenon of partial erasure of the record mark by heat diffusion in the lateral direction during the irradiation of the recording laser beam) is suppressed. There is thus provided an optical recording medium designed for use in a drive system wherein overwriting is conducted at a linear velocity $V_0$ which satisfies the relation:

$$0.6 < V_{2nd}/V_0 < 1.25$$

when $V_{2nd}$ is the overwriting linear velocity at which the frequency component corresponding to the second harmonic of the frequency of the recording signal used for the overwriting is minimized when the record marks formed by the overwriting are reproduced and measured for such frequency component. Also provided is an optical recording medium adapted for use in a drive system wherein overwriting is conducted at a linear velocity $V_0$, wherein trailing edge of the record mark formed exhibits a jitter smaller than that of the leading edge when the medium is overwritten at the linear velocity $V_0$.

18 Claims, 4 Drawing Sheets

PHASE-CHANGE OPTICAL RECORDING MEDIUM AND ITS WRITING WITH HIGH RELIABILITY AFTER LONG PERIOD USE AND/OR HIGH ENVIRONMENTAL TEMPERATURE STORAGE

BACKGROUND OF THE INVENTION

1. Field of the Invention

This invention relates to a phase change optical recording medium and a method for overwriting such optical recording medium.

2. Prior Art

Highlight is recently focused on optical recording media capable of recording information at a high density and erasing the recorded information for overwriting. For example, Specification (Ver. 1) for DVD-RAM which is a phase change optical recording disc was published in July, 1997. A phase change optical recording medium is a medium wherein a laser beam is directed to the recording layer to change its crystalline state whereupon a change of reflectance by the crystallographic change is detected for reproduction of the information. The phase change optical recording media are of great interest since the optical system of the drive unit used for their operation is simple as compared with magneto-optical recording media.

Most optical recording media of phase change type use chalcogenide systems, such as Ge—Te system and a Ge—Sb—Te system, which provide a substantial difference in reflectance between crystalline and amorphous states and have a relatively stable amorphous state. It has also recently been proposed to use new compounds known as chalcopyrites. Chalcopyrite compounds have been investigated as compound semiconductor materials and have been applied to solar batteries and the like. The chalcopyrite compounds are composed of $Ib-IIIb-VIb_2$ or $IIb-IVb-Vb_2$ as expressed in terms of the Groups of the Periodic Table and have two stacked diamond structures. The structure of chalcopyrite compounds can be readily determined by X-ray structural analysis and their basic characteristics are described, for example, in Physics, Vol. 8, No. 8 (1987), pp. 441 and Denki Kagaku (Electrochemistry), Vol. 56, No. 4 (1988), pp. 228. Among the chalcopyrite compounds, $AgInTe_2$ is known to be applicable as a recording material by diluting it with Sb or Bi. The resulting optical recording media are generally operated at a linear velocity of about 7 m/s. See Japanese Patent Application Kokai Nos. (JP-A) 240590/1991, 99884/1991, 82593/1991, 73384/1991, and 151286/1992. In addition to the optical recording media of phase change type wherein chalcopyrite compounds are used, optical recording media of phase change type wherein $AgSbTe_2$ phase is formed with the crystallization of the recording layer is disclosed in JP-A 267192/1992, 232779/1992, and 166268/1994.

When information is recorded in the optical recording medium of phase change type, the laser beam applied is of high power (recording power) such that the recording layer is heated to a temperature higher than the melting point. In the region where the recording power is applied, the recording layer is melted and thereafter quenched to form an amorphous record mark. When the record mark is erased, a laser beam of relatively low power (erasing power) is applied so that the recording layer is heated to a temperature higher than the crystallizing temperature and lower than the melting temperature. The record mark to which the laser beam of erasing power is applied is heated to a temperature higher than the crystallizing temperature and then allowed to slowly cool to recover the crystalline state. Accordingly, in the optical recording media of the phase change type, the medium can be overwritten by modulating the intensity of a single laser beam.

In the optical recording medium of phase change type, performance of the medium has been determined by whether C/N of sufficient level is realized at the linear velocity used, and whether sufficient erasability is achieved in the erasure. An excessively high erasability, however, adversely affects the performance of the medium. A high erasability means a high susceptibility of the recording layer to crystallization, when the recording layer is highly susceptible to crystallization, heat diffusion in the lateral direction during the formation of the rear end of the record mark results in the gradual cooling, and hence, recrystallization of the front end of the record mark. Such recrystallization results in the erasure of the front end of the record mark, and such erasure is referred herein as "self erasure". A medium of excessively high erasability, therefore, needs optimization in the erasability to prevent increase in jitter by such self erasure.

For example, JP-A 7176/1997 discloses a process for preventing self-erasure upon use of a medium adapted for high linear velocity at a low velocity. In this process, a pulse pattern is optimized in the pulse train of the recording laser beam depending on the linear velocity.

The inventors of the present invention, however, found that prevention of jitter increase by the optimization of the medium design is associated with a new problem. When the medium which has been designed to minimize the self-erasure at the linear velocity used is stored at a high temperature of approximately 60 to 80° C. after the formation of the record marks and the record marks are overwritten with new record marks, the original record marks can not be sufficiently erased. When the erasure of the original record marks is insufficient, the newly recorded signals can not be normally read out. Jitters and errors are thereby greatly increased. The temperature inside optical disc drives and other media drives during their operation is as high as at least about 60° C., and the medium is exposed to such high-temperature environment for a quite long time. Therefore, prevention of the decrease in the erasability by high-temperature storage is an urgent issue.

The leading edge and the trailing edge of the record marks can be separately evaluated for their jitter. The jitter at the leading edge is mainly caused by the self-erasure while the jitter at the trailing edge is mainly caused by the insufficient erasure. A reason for the increase of the jitter (total jitter) can be effectively analyzed by evaluating the jitter at each edge of the record marks.

SUMMARY OF THE INVENTION

An object of the present invention is to prevent the loss of reliability of the phase change type optical recording medium by high-temperature storage, and to suppress the self-erasure (a phenomenon of partial erasure of the record marks by heat diffusion in the lateral direction during the irradiation of the recording laser beam).

Such an object is realized by the optical recording medium and its overwriting method of the constitution as described below in any one of the (1) to (7).

(1) An optical recording medium having a recording layer of phase change type for use in a drive system wherein overwriting is conducted at a linear velocity $V_0$ which satisfies the relation:

$$0.6 < V_{2nd}/V_0 < 1.25$$

when $V_{2nd}$ is the overwriting linear velocity at which the frequency component corresponding to the second harmonic of the frequency of the recording signal used for the overwriting is minimized when the record marks formed by the overwriting are reproduced and measured for such frequency component.

(2) An optical recording medium according to the above (1) wherein the recording layer is formed on a substrate; a first dielectric layer is disposed between the substrate and the recording layer; a second dielectric layer is disposed on the recording layer; and the second dielectric layer contains nitrogen at least in the region in contact with the recording layer.

(3) An optical recording medium according to the above (1) wherein at least the region in the second dielectric layer in contact with the recording layer contains zinc sulfide and silicon oxide as its main components in addition to the nitrogen, or wherein at least the region contains silicon nitride and/or germanium nitride as its main component(s).

(4) An optical recording medium having a recording layer of phase change type for use in a drive system wherein overwriting is conducted at a linear velocity $V_0$ wherein, when the medium is overwritten at the linear velocity $V_0$, trailing edge of the record mark formed exhibits a jitter smaller than that of the leading edge.

(5) An optical recording medium 4 which is the optical recording medium of any one of the above (1) to (3).

(6) A method for overwriting an optical recording medium having a recording layer of phase change type, wherein the overwriting is conducted at a linear velocity $V_0$ which satisfies the relation:

$$0.6 \leq V_{2nd}/V_0 < 1.25$$

when $V_{2nd}$ is the overwriting linear velocity at which the frequency component corresponding to the second harmonic of the frequency of the recording signal used for the overwriting is minimized when the record marks formed by the overwriting are reproduced and measured for such frequency component.

(7) A method for overwriting an optical recording medium according to the above (6) wherein the optical recording medium is the optical recording medium of any one of the above (1) to (5).

DETAILED DESCRIPTION OF THE INVENTION

When $V_{2nd}/V_0$ is equal to or greater than 0.6, a decrease in the erasability of the medium by the high-temperature storage is suppressed, and the reliability is greatly improved. On the other hand, when $V_{2nd}/V_0$ is smaller than 1.25, an increase of jitter by the self-erasure is sufficiently suppressed.

In other words, the inventors of the present intention have found that the conventional media which exhibit little jitter increase by the self-erasure as well as good initial properties suffer from marked decrease in the erasability by high-temperature storage, and such decrease in the erasability is related to the $V_{2nd}/V_0$ before the high-temperature storage. On the bases of such findings, the lower limit for the $V_{2nd}/V_0$ is determined to realize sufficient erasability after the high-temperature storage, and the upper limit for the $V_{2nd}/V_0$ is determined to suppress the reduction in the initial properties to an acceptable level.

The optical recording medium of the present invention exhibits a jitter of the constitution which is different from conventional media since the medium of the present invention has a constitution capable of suppressing the significant deterioration of the properties by the high-temperature storage. More illustratively, in the optical recording medium of the present invention before the high-temperature storage in its normal state, the jitter at the trailing edge of the record mark mainly ascribable to insufficient erasure is lower than the jitter at the leading edge caused mainly by the self-erasure.

Next, the present invention is described in further detail by referring to embodiments of the invention.

The optical recording medium of the present invention is adapted for use in a drive system wherein overwriting is conducted at a linear velocity $V_0$. The linear velocity $V_0$ may be either a constant velocity or a variable velocity. In other words, the optical recording medium of the present invention may be used not only as a CLV disc operated at a constant velocity but also as a disc operated at variable velocity such as a CAV disc operated at a constant angular velocity or a ZCAV disc which has a plurality of concentric regions within which the disc is overwritten at a constant velocity and wherein an outer region is overwritten at slower angular velocity. The present invention is also applicable to a medium which is adapted for the overwriting at two or more linear velocities.

When a phase change type optical recording medium is recorded with signals by overwriting and the recorded signals are reproduced, the strongest frequency component found in the reproduced signals is the component corresponding to the frequency of the recorded signals, and also found are harmonic components. Of such harmonic components, the present invention focuses on the secondary harmonic component. The intensity of the secondary harmonic component varies in relation to the overwriting linear velocity. In the present invention, the medium is designed such that the overwriting linear velocity $V_{2nd}$ at which the secondary harmonic component as described above is minimized and the overwriting linear velocity $V_0$ actually used for the overwriting are in the relation:

$0.6 \leq V_{2nd}/V_0 < 1.25$, and preferably in the relation:

$0.7 \leq V_{2nd}/V_0 < 1.2$, and more preferably in the relation:
$0.8 \leq V_{2nd}/V_0 < 1.0$, and most preferably in the relation:
$0.8 \leq V_{2nd}/V_0 < 0.99$.

When $V_{2nd}/V_0$ is too small, the erasability will decrease during the high-temperature storage to result in an increased jitter after the high-temperature storage. On the other hand, when $V_{2nd}/V_0$ is too large, effect of the self-erasure will increase and the medium will suffer from an increased initial jitter.

In the measurement of the linear velocity $V_{2nd}$, the optical recording medium evaluator is used at a RBW (resolution band width) of 30 kHz and a VBW (video band width) of 100 Hz. The frequency of the reproduced signals is analyzed with a spectrum analyzer to find the variation of secondary harmonic component at different linear velocities.

When the present invention is applied to a medium operated at a non-constant linear velocity, $V_{2nd}/V_0$ is preferably within the above-defined range at all of the linear velocities used.

The linear velocity $V_{2nd}$ immediately after the initialization (crystallization of the recording layer immediately after the production of the medium) and the linear velocity $V_{2nd}$ after the high-temperature storage are different from the linear velocity $V_{2nd}$ inherent to the medium. To remove the effects of such history, the measurement of the linear velocity $V_{2nd}$ is preferably conducted after repeating at least 10 overwriting operations.

The optical recording medium of the present invention is overwritten with a laser beam modulated to include the beams of at least two levels, namely, the recording level and the erasing level. The laser beam of the recording level may be irradiated in pulse mode. By irradiating the medium at least twice for recording one signal, heat accumulation in the record mark is prevented. Dilatation of the record mark at its rear end (teardrop phenomenon) is thereby avoided, and C/N is improved. Such irradiation in pulse mode is also capable of suppressing the distortion of the record mark geometry by the self-erasure.

The wavelength λ of the laser beam used for the overwriting and the reproduction is not limited to any particular range. The wavelength λ, however, is preferably such that:

$\lambda \leq 680$ (nm)

when high-density recording is desirable.

The lens of the optical system used for the overwriting may have a NA (numerical aperture) of non-limited range. High-density recording, however, is difficult when the NA is too small. Therefore, NA is preferably in the range of:

$NA \leq 0.6$

In the present invention, linear velocity $V_0$ of the recording layer in relation to the laser beam in the overwriting is typically in the range of 0.8 to 20 m/s. The linear velocity $V_0$ is preferably at least 3.47 m/s, and more preferably at least 6 m/s, and most preferably at least 8 m/s in consideration of the transfer rate.

The structure of the phase change type optical recording medium to which the present invention is applied is not particularly limited as long as the medium is of the structure wherein a phase change type recording layer is disposed on the substrate. Typical optical recording media of the present invention are of the constitution as shown in FIGS. 1 to 6 comprising a substrate 2 and a first dielectric layer 31, a recording layer 4, and a second dielectric layer 32 disposed on the substrate 2 in this order, and an optional reflective layer 5 on the second dielectric layer 32 and an optional third dielectric layer 33 on the reflective layer 5.

In the medium of such constitution, the linear velocity $V_{2nd}$ as described above can be varied by controlling the composition, thickness, or deposition process of the recording layer, the dielectric layers, or the reflective layer.

For example, the linear velocity $V_{2nd}$ can be increased by introducing nitrogen and/or oxygen in the second dielectric layer with no significant alteration in the thermal design (such as the thickness of the dielectric layers or the reflective layer) of the medium. As a consequence, a plurality of media adapted for use at different linear velocities can be designed with no drastic change in the medium structure, and designing of the medium is facilitated. In such a case, introduction of the nitrogen and/or the oxygen is necessary only in the region in contact with the recording layer. The nitrogen and/or the oxygen, however, may be introduced in the entire second dielectric layer. For example, when the dielectric layer is of a multi-layer structure as described below, the nitrogen and/or the oxygen may be introduced only in the dielectric layer in contact with the recording layer. Use of the nitrogen is more favorable in view of the smaller adverse effect associated with the introduction.

The nitrogen and/or the oxygen may be introduced in the second dielectric layer by any procedure including the procedure wherein $N_2$ and/or $O_2$ is introduced in the sputtering atmosphere before or simultaneously with the formation of the second dielectric layer by sputtering and terminating the introduction of the $N_2$ and/or $O_2$ immediately after the start of the formation of the second dielectric layer; the procedure wherein $N_2$ and/or $O_2$ is introduced in the sputtering atmosphere before or simultaneously with the formation of the second dielectric layer and reducing the concentration of the $N_2$ and/or $O_2$ immediately after the start of the formation of the second dielectric layer; and the procedure wherein $N_2$ and/or $O_2$ is introduced in the sputtering atmosphere before or simultaneously with the formation of the second dielectric layer and continuing the introduction of the $N_2$ and/or $O_2$ during the formation of the second dielectric layer. Alternatively, introduction may be conducted by the procedure wherein $N_2$ and/or $O_2$ is introduced in the sputtering atmosphere during the formation of the recording layer by sputtering and increasing the concentration of the $N_2$ and/or $O_2$ immediately before the termination of the formation of the recording layer; or by the procedure wherein discharge treatment is conducted after the formation of the recording layer in the atmosphere containing $N_2$ and/or $O_2$ followed by the formation of the second dielectric layer. It is also possible to combine two or more such procedures.

For example, when the second dielectric layer containing zinc sulfide and silicon oxide as its main components is formed by sputtering, the sputtering may be conducted in the (Bar+$N_2$) atmosphere. In this case, higher $N_2$ flow rate generally results in the higher linear velocity $V_{2nd}$. Alternatively, when reactive sputtering is effected in a nitrogen-containing atmosphere by using Si and/or Ge for the target(s) to form the second dielectric layer containing silicon nitride and/or germanium nitride as its main component(s), the linear velocity $V_{2nd}$ of the medium will be higher than that of the medium wherein the second dielectric layer contains zinc sulfide and silicon oxide as its main components. This case also shares the situation that higher $N_2$ flow rate generally results in the higher linear velocity $V_{2nd}$.

The gas used in the introduction of the $N_2$ and/or $O_2$ to the second dielectric layer (hereinafter referred to as introduction gas) is not limited to any particular gas, and an oxidative gas other than $O_2$, such as the gas represented by $NO_x$, for example $NO_2$, can also be used.

When a mixed gas comprising an inert gas such as Ar and the introduction gas is introduced in the formation of the second dielectric layer by sputtering, the mixed gas may be introduced at a non-limited flow rate ratio [introduction gas/(Ar+introduction gas)]. The flow rate ratio, however is preferably at least 3% to sufficiently realize the effect of the gas introduction. The flow rate ratio is preferably up to 40% since increase in the flow rate ratio results in the reduced sputtering rate.

PREFERRED EMBODIMENTS OF THE INVENTION

Next, the present invention is described in further detail by referring to the preferred embodiments of the invention. Constitution of FIGS. 1, 2 and 3 (reflective structure)

Figure 1:
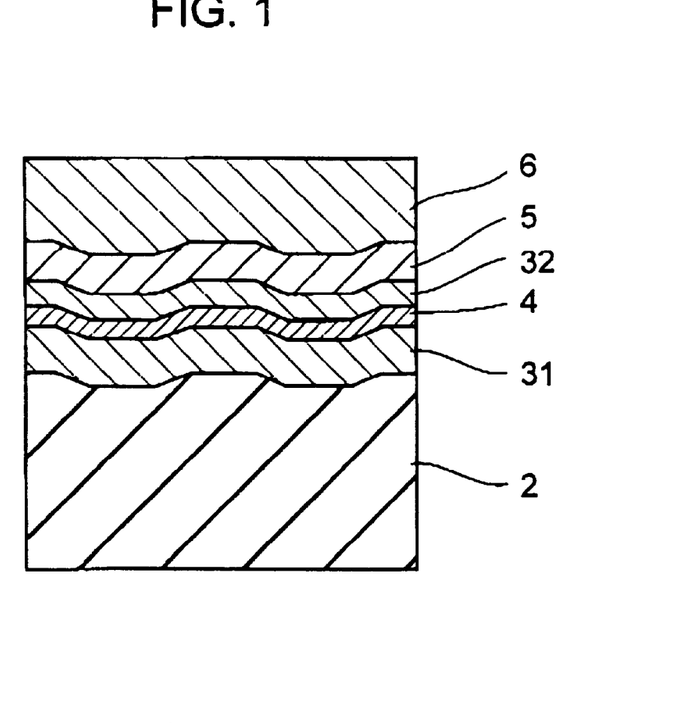
FIG. 1 is a partial cross-sectional view of an embodiment of the optical recording medium (of reflective type) according to the present invention.
Figure 2:
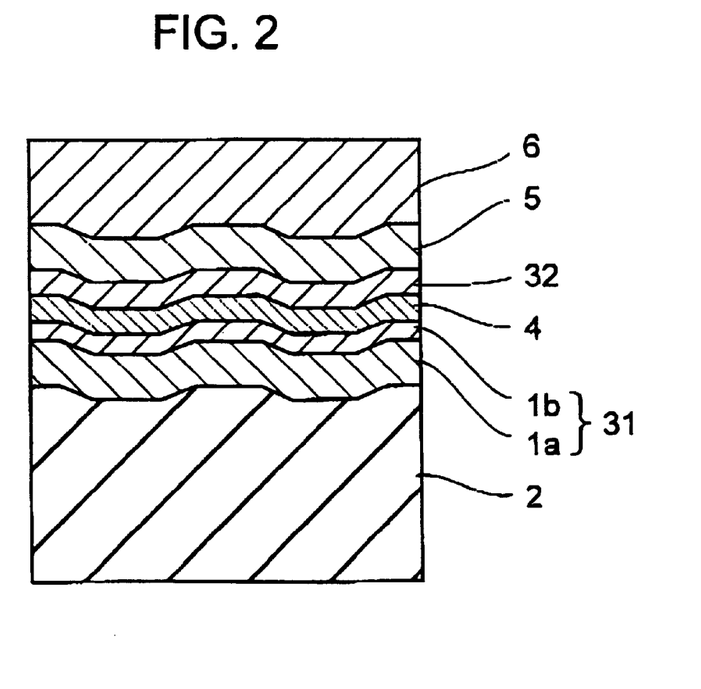
FIG. 2 is a partial cross-sectional view of another embodiment of the optical recording medium (of reflective type) according to the present invention.
Figure 3:
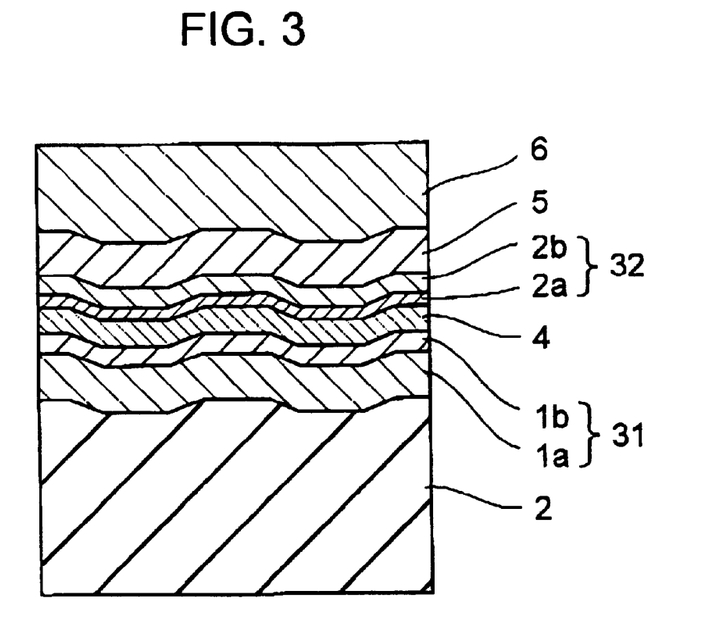
FIG. 3 is a partial cross-sectional view of another embodiment of the optical recording medium (of reflective type) according to the present invention.

Exemplary preferred embodiments of the optical recording medium of the present invention are shown in FIGS. 1, 2 and 3. These optical recording media are single side (single substrate) optical recording media which comprise a first dielectric layer 31, a recording layer 4, a second dielectric layer 32, a reflective layer 5, and a protective layer 6 on a substrate 2 formed in this order. The present invention is also applicable for a double side recording medium comprising two single side recording media which are adhered to each other by an intervening adhesive layer such that the protective layer 6 is located in the interior side of the resulting medium. The present invention is also applicable for a medium comprising the single side recording medium as described above adhered to a protective substrate by an intervening adhesive layer.

The reflective layer 5 of the optical recording media shown in FIGS. 1, 2 and 3 is typically a relatively thick metal layer, and this reflective layer is different from the medium of the absorption coefficient control structure as described below. In the present invention, such medium is referred to as the medium of reflective structure. It should be noted that a medium of reflective structure generally has the Ac/Aa as defined below of less than 0.9, although the medium may be designed to exhibit the Ac/Aa of 0.9 or higher.

Substrate

In the optical recording medium of the present invention, the recording layer 4 is irradiated with the laser beam through the substrate 2, and therefore, the substrate 2 is preferably formed of a material substantially transparent to the laser beam employed and is, for example, a resin or a glass. Typical such resins include acrylic resins, polycarbonate, epoxy resins and polyolefins. The shape and dimensions of the substrate are not critical although it is generally of disc shape having a thickness of about 0.5 to 3 mm and a diameter of about 50 to 360 mm. The substrate may be provided on its surface with a predetermined pattern of grooves for tracking and addressing purposes.

The optical recording medium of the present invention may be used either in the system wherein a groove is used for the recording track or in the system wherein a land between adjacent grooves is used for the recording track. In the case of high density recording, it is preferable to use both the land and the groove for the recording tracks (land/groove recording). In such a case, a typical recording track pitch is preferably in the range of about 0.3 to 1.0 μm.

First dielectric layer 31 and second dielectric layer 32

The first dielectric layer 31 plays the role of preventing oxidation of the recording layer and protecting the substrate by shutting off the heat which can otherwise conduct from the recording layer to the substrate upon recording. The second dielectric layer 32 plays the role of protecting the recording layer and helps the heat remaining in the recording layer after completion of recording release through heat transfer. Further, the provision of both the dielectric layers is effective for improving a degree of modulation.

The constitution of the first dielectric layer 31 is not particularly limited, and the dielectric layer 31 may be of single layer structure as shown in FIG. 1. However, the first dielectric layer 31 is preferably of dual layer structure as shown in FIGS. 2 and 3 with the constitution as described below for the purpose of increasing the number of overwritable operations.

The first dielectric layer 31 shown in FIGS. 2 and 3 comprises a dielectric layer 1a on the side of the substrate 2 and a dielectric layer 1b on the side of the recording layer 4. The dielectric layer 1a contains zinc sulfide and silicon oxide as its main components. The silicon oxide content of the dielectric layer 1a is in the range of 2 mol % to less than 40 mol % (not including 40 mol %), and preferably, 10 to 30 mol %. When the silicon oxide content of the dielectric layer 1a is too high, retractive index will be too small to realize high C/N ratio. When the silicon oxide content is too low, the number of overwritable operations will be reduced. The dielectric layer 1a may be either of homogeneous composition or of composition gradient structure in which the silicon oxide content varies incrementally or continuously.

The dielectric layer 1b may contain silicon nitride and/or germanium nitride; silicon oxide; or zinc sulfide and silicon oxide as its main component(s), and preferably, the dielectric layer 1b comprises silicon nitride and/or germanium nitride as its main components, and more preferably, the dielectric layer 1b comprises silicon nitride or germanium nitride as its main component, and most preferably, the dielectric layer 1b comprises germanium nitride as its main component. The composition of the silicon nitride contained in the dielectric layer 1b is not particularly limited, and an exemplary composition is $Si_xN_{1-x}$ (wherein x is in the range of 0.35 to 0.55). The composition of the germanium nitride contained in the dielectric layer 1b is also not particularly limited, and an exemplary composition is $Ge_xN_{1-x}$ (wherein x is in the range of 0.35 to 0.55). On the other hand, when the dielectric layer 1b comprises zinc sulfide and silicon oxide as its main components, the content of the silicon oxide is at least 40% by mole, and preferably at least 45% by mole. When the content of the silicon oxide in the dielectric layer 1b is too low, the diffusion of zinc and sulfur from the dielectric layer 1a is not sufficiently suppressed, and a number of overwritable operations is reduced due to the diffusion of zinc and sulfur to the recording layer 4.

When the second dielectric layer 32 is of single layer structure (see FIG. 2), the second dielectric layer 32 may preferably comprise zinc sulfide and silicon oxide; silicon oxide; or oxide of a rare earth metal as its main component(s). When a layer of silicon oxide or a layer of a rare earth metal oxide is disposed in contact with the recording layer, crystallization speed of the recording layer is accelerated to result in a higher linear velocity $V_{2nd}$. When there is a need to suppress the crystallization speed, the second dielectric layer 32 may be designed to have a dual layer structure as shown in FIG. 3. In this case, the dielectric layer 2a comprising zinc sulfide and silicon oxide is present between the dielectric layer 2b comprising silicon oxide or oxide of a rare earth metal and the recording layer 4. It should be also noted that the dielectric layer 2a in such a constitution will fully play its role even if the layer was quite thin, and therefore, provision of such dielectric layer 2a has no adverse effects (such as zinc and sulfur diffusion) on the recording layer.

When the second dielectric layer 32 is of single layer structure containing zinc sulfide and silicon oxide as its main components, the silicon oxide content is preferably at least 2 mol %, and more preferably at least at least 40 mol %. When the silicon oxide content of the second dielectric layer 32 is too low, influence of the zinc and sulfur diffusion from the second dielectric layer 32 to the recording layer 4 will be significant.

When the second dielectric layer 32 is of dual layer structure and a dielectric layer 2a containing zinc sulfide and silicon oxide as its main components is provided, the dielectric layer 2 a may preferably have a silicon oxide content of 5 to 60 mol %. When the silicon oxide content of the dielectric layer 2a is too low, influence of the zinc and sulfur diffusion will be significant. When the silicon oxide content of the dielectric layer 2a is too high, merit of providing the dielectric layer 2a will not be sufficiently realized.

The rare earth metal element which may be employed in the second dielectric layer 32 is not limited to any particular type, and at least one rare earth metal element selected from Ce, La, Y, Pr, Nd, Pm, Sm, Eu, Gd, Tb, Dy, Ho, Er, Tm, Yb, Lu and the like may be employed. The rare earth metal element is preferably at least one of Ce, La and Y.

It should be noted that the above-described silicon oxide content which should be fulfilled by each of the dielectric layers should be fulfilled not only as the average of each layer, and every part of the layer should be within such range.

The content of the silicon oxide used in the present invention is the value determined by $SiO_2/(ZnS+SiO_2)$ when the zinc sulfide and the silicon oxide are calculated in terms of ZnS and $SiO_2$, respectively, that is, after determining the amount of sulfur, zinc and silicon by fluorescent X-ray analysis. It should be noted that, when excessive zinc is present in relation to sulfur, or excessive sulfur is present in relation to zinc, the excessive zinc or sulfur is assumed to be present in the form of other compounds (such as ZnO or the like) or in free form, and the smaller one of the zinc content and the sulfur content is used in the determination of the ZnS content.

The first dielectric layer 31 is preferably 30 to 300 nm thick, and more preferably, 50 to 250 nm thick. When the first dielectric layer has such thickness, the damage to the substrate upon recording can be effectively prevented and higher degree of modulation is available.

The dielectric layer 1b may preferably have a thickness of 0.5 to 40 nm, and more preferably, 0.8 to 30 nm. However, it should be noted that the thickness of the dielectric layer 1b is preferably limited to less than 5 nm, and in particular, to 4 nm or less when the dielectric layer 1b is formed from silicon nitride in order to prevent the exfoliation under high temperature, high humidity conditions. On the other hand, when the dielectric layer 1b is formed from germanium nitride or ZnS—$SiO_2$, the layer is preferably deposited to a thickness of 5 to 40 nm, and more preferably to 5 to 30 nm for the purpose of improving the barrier properties since the layer comprising germanium nitride or ZnS—$SiO_2$ is resistant to exfoliation under high temperature, high humidity conditions. Improvement in the number of overwritable operations will be insufficient when the dielectric layer 1b is excessively thin or thick.

The ratio ($t_{1b}/t_1$) of the thickness of the dielectric layer 1b ($t_{1b}$) to the thickness of the first dielectric layer 31 ($t_1$) is preferably up to 0.5, and more preferably, up to 0.4. Even if the thickness of the dielectric layer 1b were within the above-specified preferable range, the number of overwritable operations will not be sufficiently improved when the ratio $t_{1b}/t_1$ is too large.

The second dielectric layer 32 is preferably 10 to 50 nm thick, and more preferably, about 13 to 35 nm thick. This thickness range ensures a fast cooling rate and thus permits to define a record mark with a clear edge, resulting in reduced jitter. Also, higher degree of modulation is available.

When the second dielectric layer 32 comprises two layers, the dielectric layer 2a may preferably have a thickness of 2 to 15 nm, and more preferably, 3 to 10 nm. When the dielectric layer 2a is too thin, the merit of providing the dielectric layer 2a is not sufficiently realized. On the other hand, when the dielectric layer 2a is too thick, influence of the zinc and sulfur dispersion of from the dielectric layer 2a to the recording layer 4 will be increased in the recording at a high power. It should he noted that the ratio ($t_{2b}/t_2$) of the thickness of the dielectric layer 2b ($t_{2b}$) to the thickness of the second dielectric layer ($t_2$) is preferably up to about 0.5.

The dielectric layer containing zinc sulfide may preferably contain an element whose standard free energy of sulfide formation is lower than the standard free energy of ZnS formation at 0 to 1000° C. (hereinafter referred to as metal element A). Incorporation of the metal element A in the dielectric layer results in the suppressed release of sulfur and zinc upon repeated overwriting, and increase of jitter is thereby prevented. This results in the increased number of overwritable operations.

The metal element A is preferably at least one member selected from Ce, Ca, Mg, Sr, Ba and Na, and use of Ce is most preferable in view of the low standard free energy of sulfide formation. For example, at 300K, the standard free energy of ZnS formation is about −230 kJ/mol, the standard free energy of CeS formation is about −540 kJ/mol, the standard free energy of CaS formation is about −510 kJ/mol, the standard free energy of MgS formation is about −390 kJ/mol, the standard free energy of SrS formation is about 500 kJ/mol, the standard free energy of BaS formation is about −460 kJ/mol, and the standard free energy of $Na_2S$ formation is about −400 kJ/mol In the ZnS-containing dielectric layer, the ratio of the metal element A to the total metal elements is less than 2 at %, preferably 1.5 at % or less, and more preferably 1.3 at % or less. When the ratio of the metal element A is in excess of such range, the effect of suppressing jitter increase upon repeated overwriting is not realized. It should be noted that the ratio of the metal element A is preferably at least 0.01 at %, and more preferably at least 0.03 at % for sufficient realization of the metal element A addition. The ratio of the metal element A to the total metal elements may be determined by fluorescent X-ray analysis or EPMA (electron probe X-ray microanalysis). It should be noted that a semimetal such as silicon is included in the "total metal elements" in the dielectric layer.

The metal element A in the dielectric layer may take the form of a simple substance, sulfide, oxide, fluoride, or the like.

The dielectric layers are preferably formed by vapor deposition such as sputtering and evaporation, and in particular, by sputtering. When the dielectric layer contains silicon nitride and/or germanium nitride as its main component(s), the dielectric layer may be formed, for example, by the sputtering wherein silicon nitride and/or germanium nitride is used for the target, or by the reactive sputtering wherein the sputtering is effected in a nitrogen-containing argon atmosphere by using a target comprising Si and/or Ge.

When the dielectric layer of composition gradient structure is formed by sputtering, the dielectric layer may be formed, for example, by multi-target sputtering utilizing two or more targets and the ratio of the power applied to each target may be incrementally or continuously altered from the initial stage to the terminal stage of the film deposition.

The metal element A may be incorporated in the dielectric layer by various methods. For example, when the metal element A is cerium, a chip comprising cerium as a simple substance or $CeO_2$ may be placed on the main target comprising the main components of the dielectric layer, or alternatively, cerium may be incorporated in the main target in the form of $CeO_2$ or other Ce compounds. When calcium or magnesium is used for the metal element A, it is possible to place a chip comprising CaO or MgO. Such oxides, however, have deliquescence, and use of such a chip is undesirable. In such a case, a chip comprising $CaF_2$ or $MgF_2$ may be placed on the main target. The situation is similar when strontium, barium, sodium and the like are used for the metal element A, and use of fluoride chip is more preferable than oxide chip in view of the deliquescence. Alternatively, calcium, magnesium, strontium, barium, and sodium may be incorporated in the main target in the form of oxide or other compounds. The main target may comprise a multi-component target such as $ZnS$—$SiO_2$, or alternatively, ZnS and $SiO_2$ may be separately used for the main targets in multi-target sputtering.

When the metal element A as described above is incorporated in the dielectric layer, the sputtering is preferably effected in a mixed atmosphere of argon and oxygen. Introduction of the oxygen into the sputtering atmosphere is particularly effective when the sputtering is conducted by placing a chip comprising the metal element A as simple substance on the main target. Such oxygen introduction, however, is also effective when the sputtering is conducted by placing a chip comprising the compound of the metal element A on the main target or by incorporating the compound of the metal element A in the main target. The amount of oxygen introduced into the sputtering atmosphere in terms of flow rate ratio between the inert gas such as argon and the oxygen $[O_2/(Bar+O_2)]$ is preferably 5 to 40%. Excessive introduction of the oxygen is undesirable since the recording power decreases with no difference in the erasing power, and the erasing power margin will be extremely narrow.

Recording layer 4

The recording layer 4 is composed of a phase change type material of non-limited composition. The present invention, however, is particularly effective for an optical recording medium of phase change type having a recording layer of Ge—Sb—Te based system or In—Ag—Te—Sb based system, and in particular, the recording layer of Ge—Sb—Te based system.

In the recording layer of germanium (Ge)-antimony (Sb)-tellurium (Te) system, the atomic ratio of germanium, antimony and tellurium is preferably represented by the formula (I):

$$Ge_a Sb_b Te_{1-a-b} \qquad (I)$$

wherein letters a and b are respectively in the range: $0.08 \leq a \leq 0.25$ and $0.20 \leq b \leq 0.40$.

If the value of a is too small in formula (I), record marks are more unlikely to crystallize and the erasability will be reduced. If the value of a is too large, much tellurium will bond to germanium with the resultant precipitation of antimony, inhibiting the formation of record marks.

If the value of b is too small in formula (I), the content of tellurium will be too much and record marks are more likely to crystallize when the medium is stored at elevated temperature with a loss of reliability. If the value of b is too large, antimony will precipitate to inhibit the formation of record marks.

The recording layer of this composition system may preferably have a thickness in the range of 14 to 50 nm. When the recording layer is too thin, growth of crystalline phase will be retarded and alteration in reflectance associated with the phase change will be insufficient. When the recording layer is too thick, reflectance and degree of modulation will be reduced.

In the recording layer of indium (In)-silver (Ag)-tellurium (Te)-antimony (Sb) system, the atomic ratio of indium, silver, tellurium, and antimony is preferably represented by the formula (II):

$$\{(In_a Ag_b Te_{1-a-b})_{1-c} Sb_c\}_{1-d} M_d$$

wherein letters a, b, c and d are in the range: $0.1 \leq a \leq 0.3$, $0.1 \leq b \leq 0.3$, $0.5 \leq c \leq 0.8$, and $0 \leq d \leq 0.10$, more preferably in the range: $0.11 \leq a \leq 0.28$, $0.15 \leq b \leq 0.28$, $0.55 \leq c \leq 0.78$, and $0.005 \leq d \leq 0.05$.

If the value of a is too small in formula (II), the indium content of the recording layer will be relatively too low and record marks will become less amorphous, resulting in a lower degree of modulation and lower reliability. If the value of a is too large, the indium content of the recording layer will be relatively too high and the reflectance of regions other than record marks will become low, resulting in a lower degree of modulation.

If the value of b is too small in formula (II), the silver content of the recording layer will be relatively too low and the recrystallization of record marks, and hence, repetitive overwriting, will become difficult. If the value of b is too large, the silver content of the recording layer will be relatively too high and excess silver will solely diffuse into the antimony phase during the recording and erasure. This results in lower rewriting durability, less stability of both the record marks and the crystalline regions, and a loss of reliability. Specifically, when the medium is stored at elevated temperature, record marks crystallize more to invite drops of C/N and degree of modulation. Additionally, the degradation of C/N and degree of modulation caused by repetitive recording is promoted.

If the value of a+b is too small, tellurium will become excessive to form a tellurium phase, which lowers the rate of crystal transition to hinder erasure. If the value of a+b is too large, it would become difficult to make the recording layer amorphous and it would become impossible to record signals.

If the value of c is too small in formula (II), change of reflectance associated with a phase change will be sufficient, but erasure would be difficult due to markedly reduced rate of crystal transition. If the value of c is too large, change of reflectance associated with a phase change will be insufficient to invite a drop of degree of modulation.

The element M in formula (II) is at least one element selected from the group consisting of H, Si, C, V, W, Ta, Zn, Ti, Ce, Tb, Ge, Sn, Pb and Y. The element M is effective for improving rewriting durability, more specifically, for restraining the erasability from lowering as a result of repetitive rewriting. It is also effective for improving reliability under severe conditions such as hot humid conditions. At least one of V, Ta, Ce, Ge and Y is preferred among the elements M because their effects are more outstanding.

If the value of d which stands for the content of element M is too large, change of reflectance associated with a phase change becomes too small to provide a sufficient degree of modulation. If the value of d is too small, effect of the addition of the element M will be insufficient.

Although it is preferred that the recording layer consists essentially of silver (Ag), antimony (Sb), tellurium (Te), indium (In), and optionally added M, it is acceptable that the silver is partially replaced by gold (Au); the antimony is partially replaced by bismuth (Bi); the tellurium (Te) is partially replaced by selenium (Se); and the indium (In) is partially replaced by aluminum (Al) and/or phosphorus (P).

The percent replacement of Ag by Au is preferably up to 50 at %, and more preferably up to 20 at %. then the percent replacement is too high, record marks are likely to crystallize, leading to loss of reliability at elevated temperature.

The percent replacement of Sb by Bi is preferably up to 50 at %, and more preferably up to 20 at %. When the percent replacement is too high, the recording layer will have an increased coefficient of absorption, and optical interference effect will be reduced. Difference in the reflectance between the crystalline and the amorphous regions will then be reduced to result in a a lower degree of modulation and a lower C/N.

The percent replacement of Te by Se is preferably up to 50 at %, and more preferably up to 20 at %. When the percent replacement is too high, the crystal transition will be retarded and the erasability be reduced.

The percent replacement of In by Al and/or P is preferably up to 40 at %, and more preferably up to 20 at %. When the percent replacement is too high, record marks will become less stable to result in a loss of reliability. The proportion of Al and P is arbitrary.

It is noted that the recording layer of this composition system after repetitive overwriting has a coefficient of absorption k of about 3.3 in the crystalline state and about 2.2 in the microcrystalline or amorphous state.

The recording layer of this composition system is preferably in the range of 9.5 to 50 nm, and more preferably 13 to 30 nm. When the recording layer is too thin, growth of crystalline phase will be retarded and alteration in reflectance associated with the phase change will be insufficient. When the recording layer is too thick, a large amount of silver will diffuse in the thickness direction of the recording layer during the formation of the recording marks and proportion of the silver diffusing in the lateral direction of the recording layer will be reduced to result in insufficient reliability of the recording layer. An excessively thick recording layer will also invite insufficient reflectance and degree of modulation.

The composition of the recording layer is identifiable by electron probe microanalysis (EPMA), X-ray microanalysis, ICP etc.

The recording layer is preferably formed by sputtering. The conditions for the sputtering are not critical, and when a material containing two or more elements are sputtered, the sputtering may be effected by using an alloy target or by using multi-target sputtering employing two or more targets.

Reflective layer 5

The reflective layer 5 may be formed from any desired material, and typically, the reflective layer 5 is formed from a metal of high reflectance such as Al, Au, Ag, Pt, Cu, Ni, Cr, or Ti as a simple substance or as an alloy containing at least one of such metals. The reflective layer is preferably about 30 to 300 nm thick. Reflectance will be insufficient with a thickness below this range. A thickness beyond this range will provide no substantial improvement in reflectance and add to the cost. The reflective layer is preferably formed by vapor deposition such as sputtering and evaporation.

Protective layer 6

The protective layer 6 is provided for improving scratch resistance and corrosion resistance. Preferably, the protective layer is formed of an organic material, typically a radiation curable compound or a composition thereof which is cured with radiation such as electron and UV radiation. The protective layer is generally about 0.1 to 100 $\mu$m thick and may be formed by conventional techniques such as spin coating, gravure coating, spray coating, and dipping.

Adhesive layer

The adhesive used for the adhesive layer is not limited to any particular type, and the adhesive may be a hot melt adhesives, a UV curing adhesive, or a room temperature curing adhesive, or alternatively, a pressure sensitive adhesive.

Figure 4:
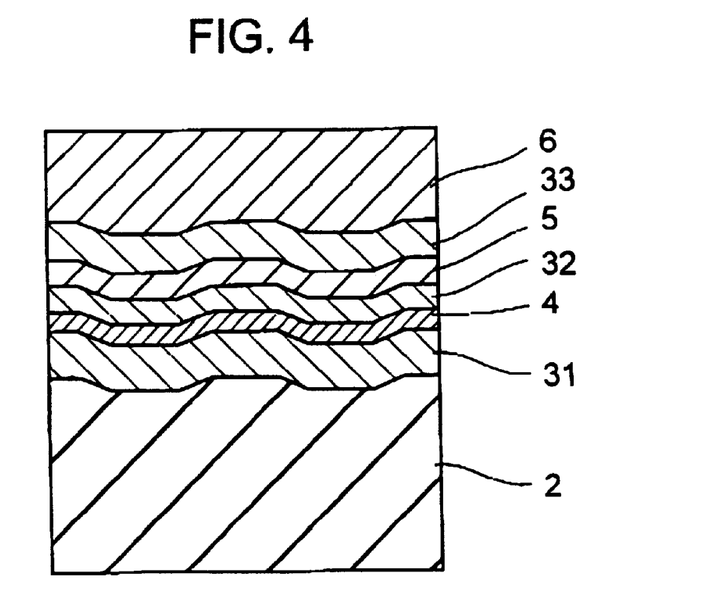
FIG. 4 is a partial cross-sectional view of an embodiment of the optical recording medium (of absorption coefficient control type) according to the present invention.
Figure 5:
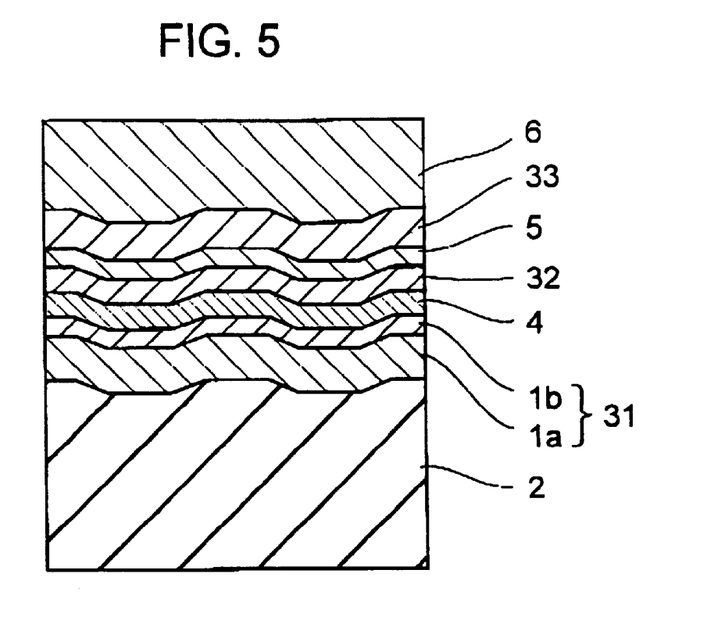
FIG. 5 is a partial cross-sectional view of another embodiment of the optical recording medium (of absorption coefficient control type) according to the present invention..
Figure 6:
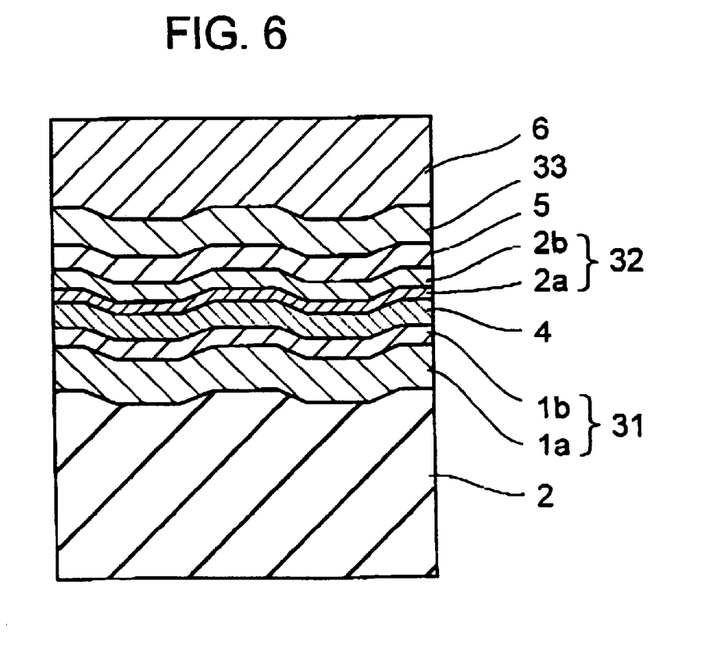
FIG. 6 is a partial cross-sectional view of another embodiment of the optical recording medium (of absorption coefficient control type) according to the present invention.

Constitution of FIGS. 4, 5 and 6 (absorption coefficient control structure)

Referring to FIGS. 4, 5 and 6, there are illustrated further embodiments of the optical recording medium to which the present invention may be applied. The optical recording medium of such type is herein referred to as the medium of absorption coefficient control structure. The absorption coefficient control structure has been selected for the reason as described below.

The optical recording medium of phase change type utilizes difference in reflectance between the crystalline and the noncrystalline state, and light absorption (Ac) of the recording layer in the region other than record marks (in crystalline state) and the light absorption (Aa) of the recording layer in the record marks (in noncrystalline state) are often different, and the Ac<Aa is the condition generally found in such a situation, it should be noted that Ac and Aa are values measured at the wavelength of the recording/reproducing laser beam. Recording sensitivity and erasability are thus different depending on whether the region overwritten is crystalline or noncrystalline, and consequently, the record marks of different length and width are formed by the overwriting to invite increase in the jitter often resulting in errors. When mark edge recording wherein the information is encoded in opposite edges of the record marks is adopted for increasing the recording density, variation in the length of the record marks has greater significance and such variation invites increased errors.

In order to solve such a situation, it is preferable that Ac is close to Aa. More preferably, Ac and Aa are such that Ac/Aa$\geq$0.9, still more preferably Ac/Aa>1, and most preferably Ac/Aa$\geq$1 in consideration of the latent heat, by regulating the thickness of the recording layer or the dielectric layers sandwiching the recording layer. In the medium of conventional structure, increase of Ac/Aa results in reduced difference between the reflectance (Rc) of the medium of the region other than the record marks and the reflectance (Ra) of the medium in the record marks, and hence, in a reduced C/N.

In view of such a situation, JP-A 124218/1996 proposes an optical information recording medium comprising a substrate, a first dielectric layer, a recording layer, a second dielectric layer, a reflective layer, a third dielectric layer, and a UV cured resin layer disposed in this order wherein Ac$\geq$Aa, and an extremely thin metal film of high light transmittance, Si or Ge is used for the reflective layer, and a dielectric material having a refractive index of higher than 1.5 is used for the third dielectric layer. The relation Ac$\geq$Aa is achieved without detracting from the high (Rc-Ra) by providing the reflective layer of high light transmittance and the third dielectric layer of high refractive index.

It should be noted that Ac and Aa can be calculated from optical constants of each layer and the wavelength of the recording/reproducing laser beam.

The optical recording media shown in FIGS. 4, 5 and 6 are respectively a single side recording medium wherein the reflective layer 5 is of the constitution as in the case of JP-A 124218/96, and wherein a third dielectric layer 33 is disposed between the reflective layer 5 and the protective layer 6. As in the case of the medium of reflective type as described above, the optical recording medium of FIG. 4, 5 or 6 may be adhered with another such medium to form a dual side recording medium, or alternatively, the medium may be adhered to a protective substrate.

In FIGS. 4, 5 and 6, the reflective layer 5 may comprise an extremely thin layer of a metal of high light transmittance or a layer of silicon or germanium having a high transmittance for the light of near infrared to infrared region including the recording/reproducing wavelength. The thickness of the reflective layer may be adequately determined to enable the control of the absorption coefficient between the region other than the record marks and the record marks as described above. The range of the preferable thickness of the reflective layer is significantly different by the material constituting the reflective layer, and the thickness may be determined in accordance with the material. When a metal such as Au is used for the reflective layer, the reflective layer may preferably have a thickness of up to 40 nm, and more preferably 10 to 30 nm. When Si or Ge is used for the reflective layer, the reflective layer may preferably have a thickness of up to 80 nm, and more preferably from 30 to 70 nm. A thickness below this range will invite decline of C/N, and a thickness beyond this range would provide no substantial improvement in the absorption coefficient control effect.

When the reflective layer 5 is formed from a metal, the reflective layer may preferably comprise Au or an alloy thereof. The Au alloy may comprise the main component of Au and at least one alloying component selected from Al, Cr, Cu, Ge, Co, Ni, Mo, Ag, Pt, Pd, Ta, Ti, Bi and Sb.

The reflective layer 5 is preferably formed by vapor deposition such as sputtering and evaporation.

The third dielectric layer 33 optionally formed on the reflective layer 5 is preferably formed from a material which has a refractive index higher than the protective layer 6. By providing such third dielectric layer 33, the Ac/Aa as described above can be increased while maintaining the difference in reflectance between the record marks and the region other than the record marks at a sufficient level as in the case of JP-A 124218/1996, supra.

The third dielectric layer 33 is preferably formed from a material adequately selected from the dielectric materials described in the explanation of the first and second dielectric layers. Although the materials used are not particularly limited, the third dielectric layer 33 may preferably contain zinc sulfide and silicon oxide as its main components.

The third dielectric layer may preferably have a thickness of 30 to 120 nm, and more preferably 40 to 90 nm. An excessively thin third dielectric layer results in the decline of the signal output, and an excessively thick third dielectric layer results in the erasure of the signals in the adjacent track (cross erase).

In the structure as described above wherein AC and Aa are controlled by using a transparent reflective layer, the recording/reproducing laser beam is generally directed from the rear side of the transparent substrate and the beam penetrates and goes out from the side of the reflective layer. The light transmittance in such instance is generally at least about 1%, and most preferably at least about 3%. It should be noted that the light transmittance is the value measured when the medium solely comprises the transparent substrate and the inorganic layers, and in the case of the construction of FIG. 4, 5 or 6, the value measured for the medium with no protection layer 6. Therefore, the light transmittance is the value as a result of multiple reflection between the inorganic layers, that is, the recording layer, the dielectric layers, the reflective layer, and the like. The light transmittance can be measured with a spectrophotometer. The region measured is not particularly limited, and the light transmittance may be measured either for a crystalline region or for a noncrystalline region. The light transmittance, however, is generally measured for the crystalline region where no grooves are defined (mirror region).

In the optical recording medium shown in FIG. 4, 5 or 6, the substrate 2, the recording layer 4, and the protective layer 6 may be of the constitution similar to those of the optical recording medium shown in FIG. 1, 2 or 3 except that the preferable thickness of the recording layer 4 is in the range of 10 to 50 nm.

The constitution of the first dielectric layer 31 and the second dielectric layer 2 in the medium of absorption coefficient control structure is not particularly limited, and the dielectric layers 31 and 32 may be of single layer structure as shown in FIG. 4. However, the first and/or the second dielectric layer may have laminate structure as shown in FIGS. 5 and 6 and the dielectric layers may preferably have the constitution as described below for the purpose of increasing the number of overwritable operations.

The first dielectric layer 31 is preferably of the same constitution as the first dielectric layer of the media of reflective structure as described in relation to FIGS. 2 and 3.

The second dielectric layer 32 may be either of single layer structure (see FIG. 5) or of laminate structure (see FIG. 6). In either case, the region of the second dielectric layer 32 in contact with the recording layer 4, namely, the entire second dielectric layer 32 in the case of FIG. 5 and the dielectric layer 2a in the case of FIG. 6, may preferably contain germanium nitride and/or silicon nitride; oxide of a rare earth metal; silicon oxide; or zinc sulfide and silicon oxide as its main components); and more preferably, germanium nitride and/or silicon nitride; or zinc sulfide and silicon oxide as its main component(s); and most preferably, germanium nitride or silicon nitride as its main component. When such region contains zinc sulfide and silicon oxide as its main components, the silicon oxide content is preferably at least 40 mol %, more preferably 40 to 80 mol %, and most preferably 40 to 60 mol %. When the silicon oxide content is too low, influence of the zinc and sulfur diffusion from the second dielectric layer 32 to the recording layer 4 will be significant, and when the silicon oxide content is too high, exfoliation is likely to take place in the second dielectric layer during the initialization and overwriting operations.

The rare earth metal element which may be employed in the second dielectric layer 32 is not limited to any particular type, and at least one rare earth metal element selected from Ce, La, Y, Pr, Nd, Pm, Sm, Eu, Gd, Th, Dy, Ho, Er, Tm, Yb, Lu and the like may be employed. The rare earth metal element is preferably at least one of Ce, La and Y.

In the optical recording medium of FIG. 6, the composition of the dielectric layer 2b formed on the dielectric layer 2a is not particularly limited. The dielectric layer 2b, however, may generally contain zinc sulfide and silicon oxide as its main components. In such a case, the silicon oxide content is preferably in the range of 2 to less than 40 mol % (excluding 40 mol %) although the content may not necessarily be within such range.

The second dielectric layer 32 may preferably have a thickness of 10 to 50 nm, and more preferably, 13 to 35 nm. When the second dielectric layer has a thickness within such range, cooling speed is increased and the edge of the record marks will be sharp to result in reduced jitter. The thickness within such range also enables increase in the degree of modulation. It should be noted that the region of the second dielectric layer in contact with the recording layer (for example, the dielectric layer 2a in the case of FIG. 6) may preferably have a thickness of at least 1 nm, and more preferably, a thickness of at least 5 nm. The region with an insufficient thickness will not play a satisfactory role as a barrier layer.

Recording and reproduction

The optical recording medium of the present invention may be overwritten as in the case of the conventional optical recording medium of phase change type.

Figure 7A:
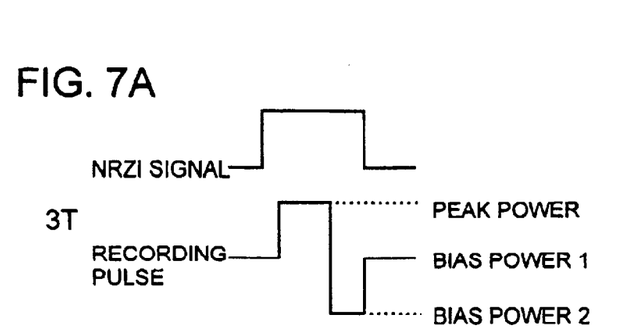
FIGS. 7A and 7B are graphs showing the modulation pattern of the laser beam used for overwriting the optical recording medium (of reflective type) according to the present invention.
Figure 7B:
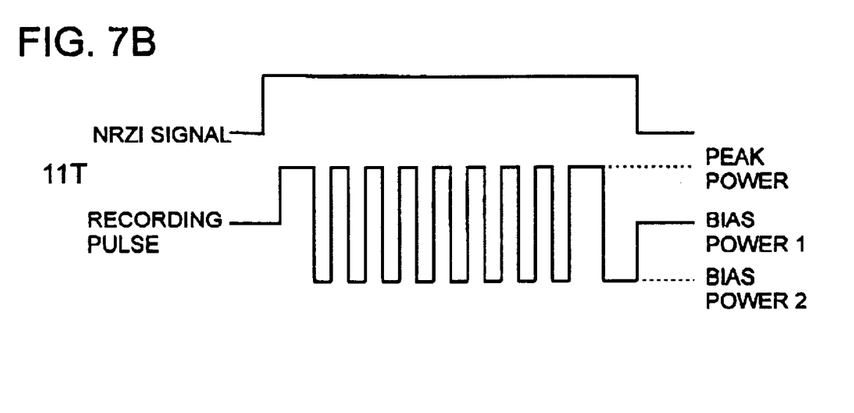

The modulation patterns of the laser beam preferable for use in the present invention are shown in FIGS. 7A and 7B. FIG. 7A shows the modulation pattern (pattern of the recording pulse) for recording with 3T signal, and FIG. 7B shows the modulation pattern for recording with 11T signal. In FIGS. 7A and 7B, time is shown in horizontal direction, and power level of the laser beam is shown in vertical direction. It should be noted that the patterns of NRZI signal for 3T and 11T are also shown in FIGS. 7A and 7B.

These modulation patterns utilize three power levels, namely, $P_P$ (peak power); $P_{B1}$ (bias power 1) lower than the $P_P$; and $P_{B2}$ (bias power 2) lower than the $P_{B1}$. Pulse modulation of the recording power is not novel in the art. However, in the conventional pulse modulation, the bottom value of the recording pulse was the erasing power $P_{B1}$. In contrast, the patterns of the present invention has the characteristic feature that the recording pulse is modulated between the peak value $P_P$ and the bottom value $P_{B2}$, and after the irradiation of the last pulse, the power level is reduced to the bottom value $P_{B2}$ and then increased to the erasing power level $P_{B2}$. By using the recording pulse of such pattern, deformation of record marks is prevented and increase of jitter can be suppressed even when the recording is conducted at a high density.

$P_P$, $P_{B1}$, and $P_{B2}$ vary with the conditions such as composition of the recording layer and linear velocity of the recording medium. However, $P_P$, $P_{B1}$, and $P_{B2}$ are generally selected from the ranges of 9 to 12 mW, 4 to 6 mW, and 0 to 2 mW, respectively. It should be noted that the recording power and the erasing power in the medium of absorption coefficient control structure is also generally selected from the ranges of 9 to 12 mW and 4 to 6 mW.

In the optical recording medium having the recording layer of the composition as described above, the light used for the overwriting and reproduction may be selected from a wide range of wavelengths, for example, from the range of 100 to 5,000 nm.

EXAMPLES

Examples of the present invention are given below by way of illustration and not by way of limitation.

Reflective structure

A disc shaped substrate 2 having a diameter of 120 mm and a thickness of 0.6 mm was prepared by injection molding polycarbonate. A groove was formed in one major surface of the substrate simultaneously with the injection molding. The groove had a width of 0.74 μm, a depth of 65 nm, and a pitch of 1.48 μm. On the grooved surface of the substrate, there were formed a first dielectric layer 31, a recording layer 4, a second dielectric layer 32, a reflective layer 5, and a protective layer 6 by the procedure as described below to produce the optical recording disc sample of the constitution as depicted in FIG. 2.

The dielectric layer 1a was formed to a thickness of 95 nm by sputtering in argon atmosphere using ZnS (80 mol %)—SiO$_2$ (20 mol %) for the target. The dielectric layer 1b comprising Ge$_3$N$_4$ was formed to a thickness of 20 nm by reactive sputtering in nitrogen-containing argon atmosphere by using Ge target.

The recording layer 4 was formed to a thickness of 20 nm by sputtering. The composition (atomic ratio) of the recording layer 4 is shown in Table 1.

The second dielectric layer 32 was formed by sputtering in argon atmosphere or in Ar+N$_2$ atmosphere using ZnS—SiO$_2$ for the target. The flow rate ratio [N$_2$/(Bar+N$_2$)] is shown in Table 1. The second dielectric layer 32 was formed to a thickness of 22 nm.

The reflective layer 5 was formed by sputtering in argon atmosphere by using Al—1.7 at % Cr for the target. The reflective layer 5 was formed to a thickness of 150 nm.

The protective layer 6 was formed by applying a UV curable resin by spin coating and exposing it to UV for curing. The protective layer as cured had a thickness of 5 μm.

The thus produced samples were initialized with a bulk eraser, and overwritten for 10 times at a linear velocity (V$_0$) of 6 m/s on an optical recording medium evaluator (laser beam wavelength, 638 nm; NA, 0.6) according to the DVD-RAM Specification as mentioned above to record 8/16 modulation signals. The medium was evaluated for the jitter. This jitter is referred to as the initial jitter. The results are shown in Table 1. This jitter value is the total jitter (unit: ) calculated by using a clock frequency (58.36 MHz). The jitter at the leading edge of the record mark mainly caused by the self-erasure and the jitter at the trailing edge of the record mark primarily ascribable to insufficient erasure were also measured. These measurements are also shown in Table 1.

The samples were then stored at 60° C. for 100 hours, and again overwritten once with the 8/16 modulation signals at the linear velocity V$_0$. The medium was then evaluated for the total jitter, which is referred to as jitter value after the storage. The results are shown in Table 1.

Next, the samples were measured for their linear velocity V$_{2nd}$ on the optical recording medium evaluator as described above at the RBW (resolution band width) of 30 kHz and the VBW (video band width) of 100 Hz by varying the linear velocity. The V$_{2nd}$ and the V$_{2nd}$/V$_0$ are shown in Table 1. The measurement of the linear velocity V$_{2nd}$ was conducted by the procedure as described below.

1) The track to be measured is overwritten for 10 times with 8/16 modulation signals at a linear velocity (V$_0$) of 6 m/s.

2) The track is recorded once with signals (3T signal: 4.88 MHz) comprising a single frequency component corresponding to the shortest mark length of the 8/16 modulation signals as described above.

3) The track is recorded once with signals (14T signal: 1.03 MHz) comprising a single frequency component corresponding to the longest mark length of the 8/16 modulation signals as described above, and the recorded signals are reproduced to measure the proportion of the second harmonic in the recorded signals.

4) The measurements of the above 1) to 3) are repeated after changing the linear velocity. The clock frequency which determines the mark length is varied in relation to the linear velocity so that the recording density is identical at every linear velocity.

The recording pulse used was the one as described below.
Recording Pulse
Pulse pattern: The exemplary patterns shown in FIGS. 7A and 7B.
Recording power (peak power): 11.0 mW
Erasing power (bias power 1): 5.0 mW
Bottom power (bias power 2): 0.5 mW

TABLE 1

$v_o = 6$ [m/s]

| Sample No. | Composition of recording layer (atomic ratio) | Flow rate ratio $N_2/(Ar + N_2)$ | $V_{2nd}$ (m/s) | $V_{2nd}/V_0$ | Jitter (ns) Leading edge | Jitter (ns) Trailing edge | Total jitter (%) Initial | Total jitter (%) After storage |
|---|---|---|---|---|---|---|---|---|
| 101 (comp.) | $Ge_{22}Sb_{22}Te_{56}$ | 0 | 3.5 | 0.58* | 2.5 | 2.5 | 7.3 | 20.0* |
| 102 | $Ge_{22}Sb_{22}Te_{56}$ | 0.04 | 5.3 | 0.88 | 2.7 | 2.4 | 7.5 | 8.8 |
| 103 | $Ge_{22}Sb_{22}Te_{56}$ | 0.06 | 5.9 | 0.98 | 4.9 | 2.3 | 11.2 | 11.2 |
| 104 (comp.) | $Ge_{22}Sb_{22}Te_{56}$ | 0.10 | 7.5 | 1.25* | 9.0 | 4.0 | 20.3* | 20.0* |

*) outside the scope of the present invention or preferred range

As demonstrated in Table 1, the samples wherein $V_{2nd}/V_0$ is designed to be within the determined range exhibited sufficiently low jitter even after the high-temperature storage. Sample No. 101 wherein $V_{2nd}/V_0$ is below the range of the present invention exhibited the leading edge jitter and the initial total jitter which are slightly lower than those of the samples of the present invention. The total jitter after the high-temperature storage of this sample, however, was much higher than those of the present samples. It should be noted that the preferable range for the total jitter shown in Table 1 is up to 15%. The jitter in excess of 15% is likely to result in increased occurrence of troubles including abnormal system operation and frequent errors.

Absorption coefficient control structure

Optical recording disc samples having the above-described absorption coefficient control structure were prepared, and the discs were evaluated for the relation between the $V_{2nd}/V_0$ and bit error rate (BER). The measurement was conducted on the optical recording medium evaluator (which is the same as the one used in Example 1 except that the laser beam used had a wavelength of 680 nm) at a linear velocity of 12 m/s. 1–7 RLL signal was used for the recording signal.

The results indicated that BER is as small as $1 \times 10^{-6}$ or less when $V_{2nd}/V_0$ is in the range of $0.6 \leq V_{2nd}/V_0 < 1.25$, and that the merits of the present invention are also realized in the medium of the absorption coefficient control structure.

The results shown in the Examples as described above demonstrate the merits of the present invention.

JP-A 44329/1998 is incorporated herein by reference.

Although some preferred embodiments have been described, many modifications and variations may be made thereto in the light of the above teachings. It is therefore to be understood that, within the scope of the appended claims, the invention may be practiced otherwise than as specifically described.

What is claimed is:

1. An optical recording medium having a recording layer of phase change type for use in a drive system wherein overwriting is conducted at a linear velocity $V_o$ which satisfies the relation:

$$0.6 \leq V_{2nd}/V_0 < 1.25$$

when $V_{2nd}$ is the overwriting linear velocity at which the frequency component corresponding to a second harmonic of the frequency of the recording signal used for the overwriting is minimized when the record marks formed by the overwriting are reproduced and measured for the frequency component.

2. An optical recording medium according to claim 1 wherein the recording layer is formed on a substrate; a first dielectric layer is disposed between the substrate and the recording layer; a second dielectric layer is disposed on the recording layer; and the second dielectric layer contains nitrogen at least in the region in contact with the recording layer.

3. An optical recording medium according to claim 2 wherein at least the region in said second dielectric layer in contact with the recording layer contains zinc sulfide and silicon oxide as its main components in addition to the nitrogen.

4. An optical recording medium having a recording layer of phase change type for use in a drive system wherein overwriting is conducted at a linear velocity $V_0$ wherein, when the medium is overwritten at the linear velocity $V_0$, a trailing edge of the record mark formed exhibits a jitter smaller than that of the leading edge.

5. A method for overwriting an optical recording medium having a recording layer of phase change type, wherein the overwriting is conducted at a linear velocity $V_0$ which satisfies the relation:

$$0.6 \leq V_{2nd}/V_0 < 1.25$$

when $V_{2nd}$ is the overwriting linear velocity at which the frequency component corresponding to a second harmonic of the frequency of the recording signal used for the overwriting is minimized when the record marks formed by the overwriting are reproduced and measured for the frequency component.

6. An optical recording medium according to claim 2, wherein at least the region in said second dielectric layer in contact with the recording layer contains one of silicon nitride and germanium nitride as its main component.

7. An optical recording medium according to claim 4, wherein the linear velocity $V_o$ satisfies the relation:

$$0.6 \leq V_{2nd}/V_0 < 1.25$$

when $V_{2nd}$ is the overwriting linear velocity at which the frequency component corresponding to a second harmonic of the frequency of the recording signal used for the overwriting is minimized when the record marks formed by the overwriting are reproduced and measured for the frequency component.

8. An optical recording medium according to claim 7, wherein the recording layer is formed on a substrate; a first dielectric layer is disposed between the substrate and the recording layer; a second dielectric layer is disposed on the recording layer; and the second dielectric layer contains nitrogen at least in the region in contact with the recording layer.

9. An optical recording medium according to claim 8, wherein at least the region in said second dielectric layer in contact with the recording layer contains zinc sulfide and silicon oxide as its main components in addition to the nitrogen.

10. An optical recording medium according to claim 8, wherein at least the region in said second dielectric layer in contact with the recording layer contains one of silicon nitride and germanium nitride as its main component.

11. A method for overwriting an optical recording medium according to claim 5, wherein the recording layer is formed on a substrate; a first dielectric layer is disposed between the substrate and the recording layer; a second dielectric layer is disposed on the recording layer; and the second dielectric layer contains nitrogen at least in the region in contact with the recording layer.

12. A method for overwriting an optical recording medium according to claim 11, wherein at least the region in said second dielectric layer in contact with the recording layer contains zinc sulfide and silicon oxide as its main components in addition to the nitrogen.

13. A method for overwriting an optical recording medium according to claim 11, wherein at least the region in said second dielectric layer in contact with the recording layer contains one of silicon nitride and germanium nitride, as its main component.

14. A method for overwriting an optical recording medium having a recording layer according to claim 5, wherein when the medium is overwritten at the linear velocity $V_o$, a trailing edge of the record mark formed exhibits a jitter smaller than that of a leading edge.

15. A method for overwriting an optical recording medium according to claim 14, wherein the linear velocity $V_o$ satisfies the relation:

$$0.6 \leq V_{2nd}/V_0 < 1.25$$

when $V_{2nd}$ is the overwriting linear velocity at which the frequency component corresponding to a second harmonic of the frequency of the recording signal used for the overwriting is minimized when the record marks formed by the overwriting are reproduced and measured for the frequency component.

16. A method for overwriting an optical recording medium according to claim 15, wherein the recording layer is formed on a substrate; a first dielectric layer is disposed between the substrate and the recording layer; a second dielectric layer is disposed on the recording layer; and the second dielectric layer contains nitrogen at least in the region in contact with the recording layer.

17. A method for overwriting an optical recording medium according to claim 16, wherein at least the region in said second dielectric layer in contact with the recording layer contains zinc sulfide and silicon oxide as its main components in addition to the nitrogen.

18. A method for overwriting an optical recording medium according to claim 16, wherein at least the region in said second dielectric layer in contact with the recording layer contains one of silicon nitride and germanium nitride, as its main component.

* * * * *

UNITED STATES PATENT AND TRADEMARK OFFICE
CERTIFICATE OF CORRECTION

PATENT NO. : 6,154,437

DATED : November 28, 2000

INVENTOR(S): Hajime Utsunomiya, et al.

It is certified that an error appears in the above-identified patent and that said Letters Patent is hereby corrected as shown below:

On title page, item 30, change " Feb. 10, 1999" to --Feb. 10, 1998--.

Signed and Sealed this

Fifteenth Day of May, 2001

Attest:

NICHOLAS P. GODICI

Attesting Officer  Acting Director of the United States Patent and Trademark Office

UNITED STATES PATENT AND TRADEMARK OFFICE
CERTIFICATE OF CORRECTION

PATENT NO.    : 6,154,437
DATED         : November 28, 2000
INVENTOR(S)   : Hajime Utsunomiya et al.

It is certified that error appears in the above-identified patent and that said Letters Patent is hereby corrected as shown below:

Title page,
Item [30], Foreign Application Priority Data, change "Feb. 10, 1999" to -- Feb. 10, 1998 --.

Signed and Sealed this

Twenty-first Day of September, 2004

JON W. DUDAS
*Director of the United States Patent and Trademark Office*